United States Patent [19]

Tsuneki

[11] Patent Number: 4,908,735
[45] Date of Patent: Mar. 13, 1990

[54] ELECTRONIC APPARATUS REDUCING GENERATION OF ELECTRO MAGNETIC INTERFERENCE

[75] Inventor: Yukio Tsuneki, Tachikawa, Japan
[73] Assignee: Kabushiki Kaisha Toshiba, Kanagawa, Japan
[21] Appl. No.: 110,344
[22] Filed: Oct. 20, 1987
[30] Foreign Application Priority Data
Oct. 24, 1986 [JP] Japan ................. 61-252876
[51] Int. Cl.⁴ .................................. H05K 1/16
[52] U.S. Cl. ........................ 361/406; 174/36; 361/400
[58] Field of Search ............... 174/36, 68.5; 361/413, 361/400, 402, 406

[56] References Cited

U.S. PATENT DOCUMENTS

| | | | |
|---|---|---|---|
| 3,486,077 | 12/1969 | Oeler et al. | 361/400 |
| 3,591,834 | 7/1971 | Kolias | 361/413 |
| 3,703,604 | 11/1972 | Henschen et al. | 174/36 X |
| 3,714,709 | 2/1973 | Liederbach | 361/402 X |
| 3,818,117 | 6/1974 | Reyener et al. | 174/36 |
| 3,973,817 | 8/1976 | Stalley et al. | 361/413 |
| 4,330,684 | 5/1982 | Hayward | 174/68.5 |
| 4,362,899 | 12/1982 | Borrill | 174/36 |
| 4,437,140 | 3/1984 | Ohyama et al. | 361/402 |
| 4,583,150 | 4/1986 | Boonstra | 174/68.5 X |
| 4,605,915 | 8/1986 | Marshall et al. | 174/36 X |
| 4,617,471 | 10/1986 | Suzuki et al. | 361/406 X |

OTHER PUBLICATIONS

Hammer et al., Protection of Printed-Circuit Cards, IBM Tech. Discl. Bull., v. 19, #5, Oct. 1976, pp. 1528 and 1529 relied on.

*Primary Examiner*—Gerald P. Tolin
*Attorney, Agent, or Firm*—Finnegan, Henderson, Farabow, Garrett and Dunner

[57] ABSTRACT

An electronic apparatus comprising a printed circuit board including a circuit for inputting and outputting signals between an external apparatus through a connector which can effectively chassis-earth high frequency noise generated from a circuit of the printed circuit board due to a first conductive pattern electrically connecting the connector and the circuit of the printed circuit board, a second conductive pattern connected to a chassis-earth, and a condenser provided between one end portion of the first conductive pattern and the second conductive pattern, The width of the one end portion of the first conductive pattern between the condenser and the connector is formed to be wider than the width of the portion of the first conductive pattern between the condenser and the circuit of the printed circuit board.

4 Claims, 2 Drawing Sheets

ELECTRONIC APPARATUS REDUCING GENERATION OF ELECTRO MAGNETIC INTERFERENCE

FIELD OF THE INVENTION AND RELATED ART STATEMENT

The present invention relates to a countermeasure against an electro magnetic interference (hereinafter called as EMI) in an electronic apparatus connected to an external apparatus through a cable.

Generally, EMI is from an electronic apparatus such as a personal computer, printer, etc., in which a large amount of digital IC devices are employed.

The EMI is apt to be generated in the vicinity of a connecting cable and it inflicts an injury upon a receiver such as a television or a, radio, etc.

In FIG. 4, for example, when high frequency noise is generated in the IC device for interfacing installed in the printer, the noise reaches the cable 4 via the connectors 2 and 3. In this case, EMI is generated in the vicinity of the cable 4 by the inductance component in the path.

In the conventional technique, a high cost electromagnetic shield material is used in the vicinity of the connector and the cable for suppressing the EMI. However, it brings the problem that the product becomes very costly.

OBJECT AND SUMMARY OF THE INVENTION

The present invention has been accomplished under the situation mentioned above, and its object is to provide an electronic apparatus which enables the suppression of EMI without using the high cost shield material, and therefore, the cost of the product can be reduced.

The feature of the present invention resides in that in an electronic apparatus having a printed circuit board including a circuit for inputting and outputting signals between an external apparatus through a predetermined connector, the printed circuit board comprises a first conductive pattern electrically connecting the connector and a circuit of the printed circuit board, a second conductive pattern connected to a chassis-earth, and a condenser connected to the first conductive pattern at one end and to the second conductive pattern, wherein a portion of the first conductive pattern between the one end of the condenser and the connector is wider than a portion of the first conductive pattern between the one end of the condenser and the circuit of the printed circuit board.

According to the electron device of the present invention, since the pattern width of one end portion of the first conductive pattern between a condenser and a connector is wider than that of the other end portion of the first conductive pattern between the condenser and the circuit of the printed circuit board, the inductance component between the connector and the condenser becomes small. The same result is obtained as if the end portion of the condenser were connected directly to the connector. Therefore, high frequency noise generated from the circuit of the circuit board can be efficiently chassis-earthed through the condenser.

DETAILED DESCRIPTION OF PREFERRED EMBODIMENT

Figure 1:
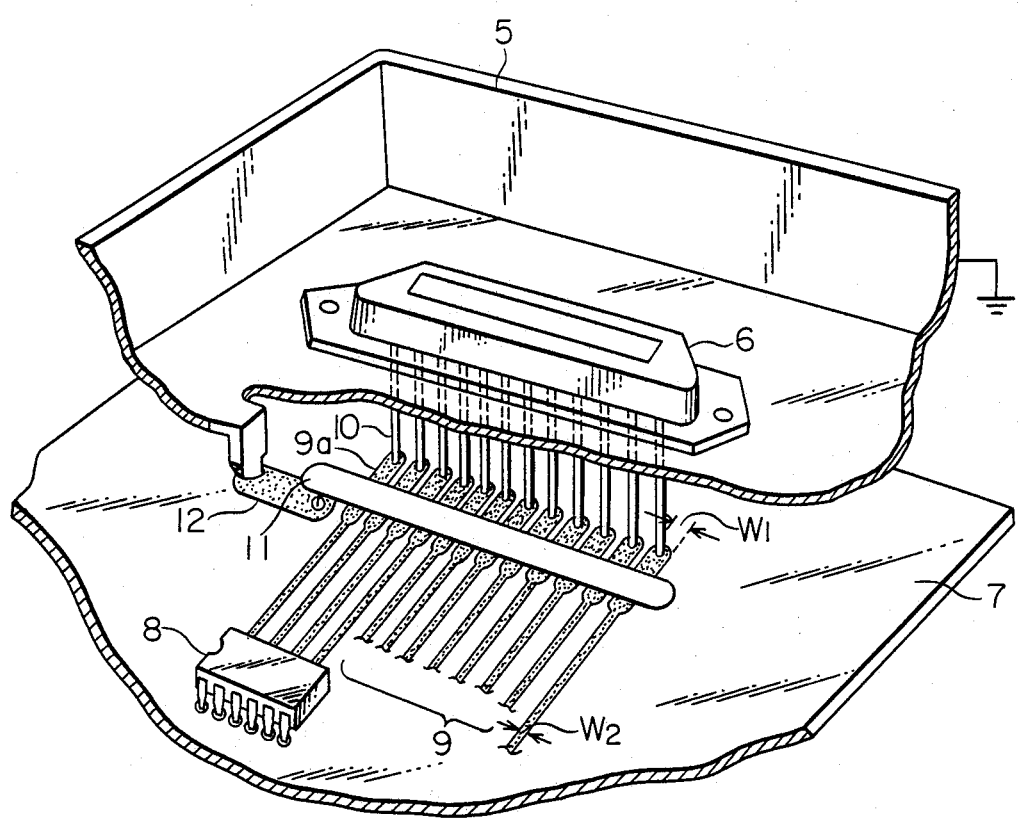
FIG. 1 is a perspective view showing a construction of an embodiment of the present invention.

Now, the embodiment of the present invention will be explained in detail by referring to the drawings.

FIG. 1 is a perspective view showing a construction of an embodiment of the present invention.

In this figure, the numeral 5 is a plate made of metal and installed in the back surface of an apparatus, 6 numeral is a connector fixed to the plate 5 and connected by a cable, numeral 7 is a printed circuit board assembled in the plate 5, numeral 8 is an IC device for interface outputting signals to an external apparatus through the connector 6. (Herein, the IC device is, for example, "HEX INVERTER BUFFERS/DRIVERS WITH OPEN-COLLECTOR HIGH-VOLTAGE OUTPUT" which is the product of TEXAS INSTRUMENTS, manufactured as the SN 7406).

Numeral 9 is a conductive pattern for input and output signals formed on the printed circuit board 7, numeral 10 is a lead pin electrically connected to the conductive pattern 9 extending from the connector, numeral 11 is a condenser module mentioned below, and numeral 12 is a conductive pattern for chassis-earth formed on the printed circuit board 7 and connected electrically to the plate 5.

In the figure, some of the conductive patterns 9 are connected to the IC device 8, and the remaining conductive patterns are connected to the circuit (not shown) for inputting signals to the apparatus and the circuit (not shown) for controlling the apparatus.

In this embodiment, the width $W_1$ of the portion $9a$ of the conductive pattern 9 near the pin 10 and formed on the printed circuit board 7 is very wide in comparison with the width $W_2$ of the portion of the conductive pattern 9 near the IC device 8. For example, when the width $W_2$ is about 0.5 mm, the width $W_1$ is about 3 to 4 mm.

Figure 2:
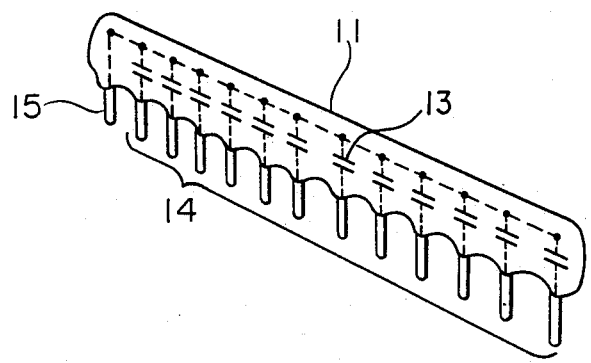
FIG. 2 is a perspective view showing a construction of a condenser module used in the embodiment.

FIG. 2 shows a construction of the condenser module 11 mentioned above.

The condenser module 11 has a plurality of condensers 13 therein, and one electrode of each of the condensers 13 is connected to one of the lead pins 14 externally led out, the other electrodes of the condensers 13 are commonly connected to the lead pin 15 externally led out.

Figure 3:
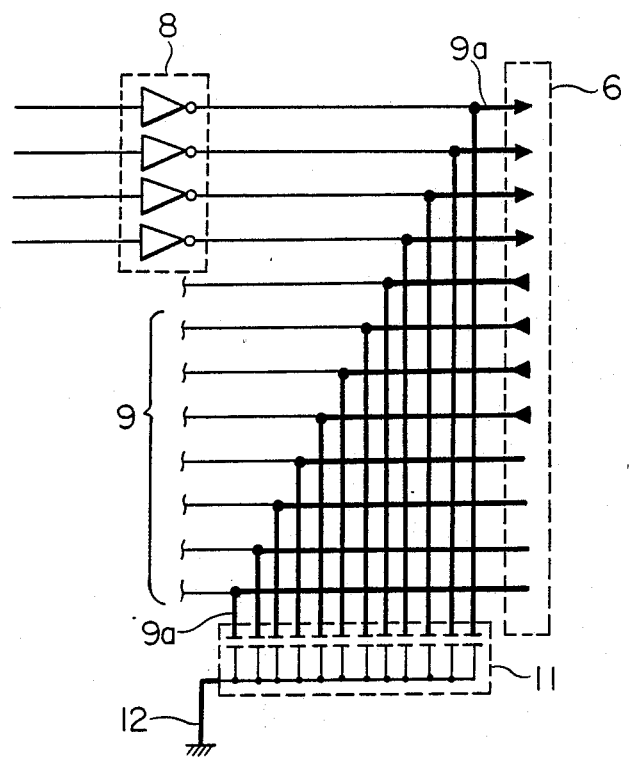
FIG. 3 is an electrical circuit diagram of the construction of the embodiment.
Figure 4:
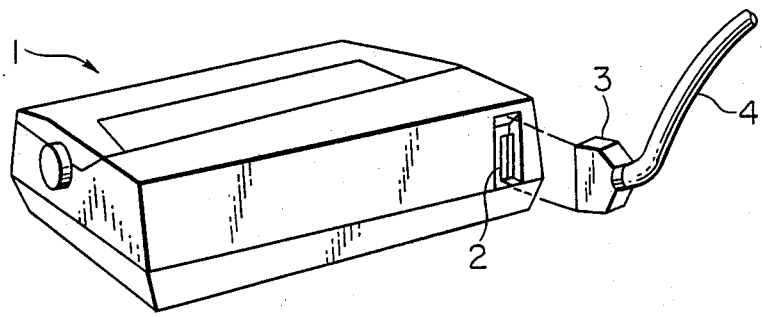
FIG. 4 is a diagram showing a state near a connector and a cable in a printer of the conventional technique.

FIG. 3 shows the circuit construction of the embodiment, and the parts common with the parts shown in FIG. 1 are represented by the same numerals.

In the figure, the wide portions of the conductive patterns 9 and 12 are shown by the wide lines. In this figure, some of the conductive patterns 9 are connected to the IC device 8, and the remaining conductive patterns are connected to the circuit (not shown) for inputting signals to the apparatus and the circuit (not shown) for controlling the apparatus.

It is preferrable for the condenser module 11 to be directly connected to the connector 6. However, in many cases, a direct connection is difficult because of the problems of mounting and cost. In addition, it is hard to shorten the distance between the IC device 8 and the connector 6.

As a countermeasure for this problem, in the embodiment, high frequency noise flowing through the conductive pattern 9 at a distance are chassis-earthed through the condenser module 11.

Further, to use effectively the capacitance component in the condenser module 11, it is necessary for the inductance component on the conductivity pattern 9 to be extremely small. Therefore, according to the embodiment, the pattern width (9a) of the conductive pattern 9 at a portion between the lead pin 14 of the condenser module 11 and the lead pin 10 of the connector 6 is extemely wider than the pattern width of a portion between the lead pin 14 of the condenser module 11 and the lead pin of the IC device 8, and therefore, the inductance component between the lead pin 14 of the condenser module 11 and the lead pin 10 of the connector 6 becomes extremely small. Consequently, a similar result is obtained as if the condenser module 11 were connected directly to the pin 10 of the connector 6.

The lead pin 15 of the condenser module 1 is also chassis-earthed through a conductive pattern 12 of wide width.

Therefore, according to the embodiment, the high frequency noise produced in the conductive pattern 9 is effectively chassis-earthed. Accordingly, the high frequency noise hardly flows from the cableplug settled in the connector 6 to the cable 4, and the level of EMI generated in the vicinity of the cable can be extremely reduced.

As mentioned above, the electronic apparatus of the present invention can effectively chassis-earth the high frequency noise generated from the internal circuit, because the condenser is interposed between the internal circuit and the cable connector, and the conductive pattern between the condenser and the cable connector has a wider width in comparison with the other conductive patterns. Therefore, a high cost shield material is not necessary, and the product can be produced for a low cost. Further, the present invention can be realized very easily because all that is necessary is some modification of the shape of the conductive pattern provided on the board.

The present invention can be applied to any electric apparatus as well as a personal computer, printer, etc., which have internally a circuit generating high frequency noise.

What is claimed is:

1. In an electronic apparatus having a printed circuit board including a circuit for inputting and outputting electric signals between an external apparatus separate from said electronic apparatus and an internal circuit on the printed circuit board through a connector, the circuit for inputting and outputting signals comprising:

a first conductive pattern electrically connecting the connector and the internal circuit on the printed circuit board;

a second conductive pattern connected to a ground potential; and a condenser connected between the first conductive pattern at a point of contact and the second conductive pattern, wherein a portion of the first conductive pattern between said point of contact with said condenser and said connector is wider than a portion of the first conductive pattern between said point of contact with said condenser and said internal circuit on the printed circuit board.

2. The circuit according to claim 1, wherein said internal circuit on the printed circuit board comprises at least one integrated circuit device.

3. The circuit according to claim 1, wherein the width of said second conductive pattern is wider than the width of said portion of said first conductive pattern between the point of contact of the first conductive pattern with said condenser and the internal circuit on the printed circuit board.

4. The circuit according to claim 1, wherein said internal circuit on the printed circuit board is an interfacing circuit used in a printer.

* * * * *